(12) United States Patent
Rozenberg

(10) Patent No.: US 9,577,682 B2
(45) Date of Patent: Feb. 21, 2017

(54) ADAPTIVE FORWARD ERROR CORRECTION (FEC) SYSTEM AND METHOD

(71) Applicant: Adi Rozenberg, Shoham (IL)

(72) Inventor: Adi Rozenberg, Shoham (IL)

( * ) Notice: Subject to any disclaimer, the term of this patent is extended or adjusted under 35 U.S.C. 154(b) by 111 days.

(21) Appl. No.: 14/370,030

(22) PCT Filed: Dec. 31, 2012

(86) PCT No.: PCT/IL2012/000402
§ 371 (c)(1),
(2) Date: Jun. 30, 2014

(87) PCT Pub. No.: WO2013/098810
PCT Pub. Date: Jul. 4, 2013

(65) Prior Publication Data
US 2014/0317475 A1    Oct. 23, 2014

(30) Foreign Application Priority Data

Jan. 1, 2012 (IL) .......................... 217307

(51) Int. Cl.
*H03M 13/35* (2006.01)
*H03M 13/29* (2006.01)
*H04L 1/18* (2006.01)

(52) U.S. Cl.
CPC ....... *H03M 13/35* (2013.01); *H03M 13/2909* (2013.01); *H03M 13/353* (2013.01);
(Continued)

(58) Field of Classification Search
CPC ..... H04L 1/0001; H04L 1/0009; H04L 1/001; H04L 1/0011; H04L 1/18; H04L 1/1812;
(Continued)

(56) References Cited

U.S. PATENT DOCUMENTS

| | | | | |
|---|---|---|---|---|
| 2003/0126238 A1* | 7/2003 | Kohno | ................. | H04L 1/0009 709/220 |
| 2005/0182850 A1* | 8/2005 | Kohno | ................. | H04L 1/0009 709/236 |

(Continued)

OTHER PUBLICATIONS

Standard ProMpeg or SMPTE2022-1 ; The Society of Motion Picture and Television Engineers Family: MPEG-2 Streams on IP Networks doi: 10.5594/S9781614826156 ISBN: 978-1-61482-615-6 http://standards.smpte.org/content/st-2022-1-2007/SEC1.abstract.html?ijkey=47a51eee1bfae0d2f0eae6a4234a8a912e9c3b6b&keytype2=tf_ipsecsha.

(Continued)

*Primary Examiner* — Albert Decady
*Assistant Examiner* — Christian Dorman
(74) *Attorney, Agent, or Firm* — 1st-Tech-Ideas; Haim M. Factor

(57) ABSTRACT

In a network for reliable transfer of packets from a transmitter to a receiver using an Internet Protocol (IP), a system for packet recovery comprising a detection block (detector) for packet loss detection and a probe device (probe) for Forward Error Correction (FEC) packets transmission, wherein the detector includes means for sending a missing packet report to the probe upon detecting a missing packet, wherein the probe includes means for storing received packets, sending FEC packets and adapting a size of the FEC packets to an error rate computed from the missing packet reports, wherein the size of FEC packets is made larger or smaller responsive to the error rate increasing or decreasing, respectively, and wherein the probe is located close to the transmitter for reliable packets reception and the detector is located close to the receiver for reliably detecting loss of packets in a receiver's surroundings.

15 Claims, 16 Drawing Sheets

(52) U.S. Cl.
CPC .............. *H04L 1/1819* (2013.01); *H04L 1/18* (2013.01); *H04L 1/1812* (2013.01); *H04L 1/1874* (2013.01); *H04L 1/1877* (2013.01); *H04L 1/1896* (2013.01)

(58) Field of Classification Search
CPC ... H04L 1/1819; H04L 1/1874; H04L 1/1877; H04L 1/1896; H03M 13/35; H03M 13/353; H03M 13/2909; H03M 13/6306
See application file for complete search history.

(56) References Cited

U.S. PATENT DOCUMENTS

| | | | | |
|---|---|---|---|---|
| 2005/0276249 | A1* | 12/2005 | Damnjanovic | H04L 1/1887 370/335 |
| 2009/0168708 | A1* | 7/2009 | Kumar | H04L 1/188 370/329 |
| 2009/0193318 | A1* | 7/2009 | Schoenblum | H04L 12/2801 714/776 |
| 2009/0222709 | A1 | 9/2009 | Lin et al. | |
| 2009/0323632 | A1* | 12/2009 | Nix | H04L 29/125 370/331 |
| 2010/0023842 | A1 | 1/2010 | Rahrer | |
| 2011/0261145 | A1* | 10/2011 | Kamath | H04N 7/148 348/14.08 |

OTHER PUBLICATIONS

Transport Stream, MPEG-2 Part 1, Systems (formally known as ISO/IEC standard 13818-1 or ITU-T Rec. H.222.0); http://www.itu.int/rec/T-REC-H.222.0 http://www.iso.org/iso/iso_catalogue/catalogue_ics/catalogue_detail_ics.htm?csnumber=22989 http://www.iso.org/iso/catalogue_detail?csnumber=31537.

Real-time Transport Protocol (RTP)—Audio-Video Transport Working Group of the Internet Engineering Task Force (IETF) and first published in 1996 as RFC 1889, superseded by RFC 3550 in 2003 http://www.rfc-base.org/rfc-3550.html.

* cited by examiner

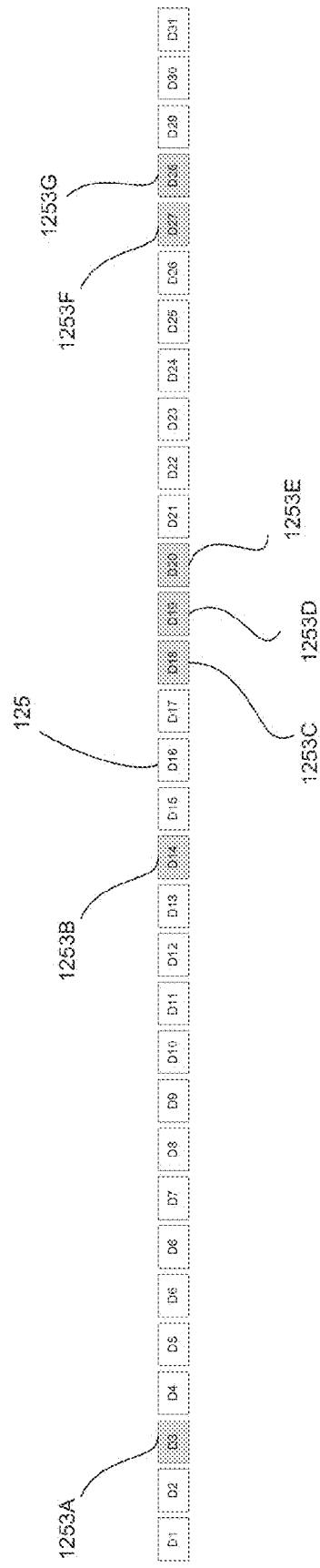

ADAPTIVE FORWARD ERROR CORRECTION (FEC) SYSTEM AND METHOD

This US National Stage application claims priority from claims priority from Israel patent application no. 217307, filed 1 Jan. 2012 and from PCT application no. PCT/IL2012/000402, filed 31 Dec. 2012, whose disclosures are incorporated herein by reference.

Embodiments of the present invention relate to systems for media stream transmission using an adaptive size FEC matrix and adaptive on demand media packet loss recovery.

BACKGROUND

Standard ProMpeg or SMPTE2022-1 forward error correction (FEC) calls for the use of a constant predefined dimension matrix to be sent between a sender and recipients (see FIG. 1). A predefined matrix cannot respond to changes in the network. An adaptive approach, where the recipients signals to the sender on errors, can give the sender an option to modify matrix dimension to better handle the current and the next failures.

FIG. 1 (Prior art) shows a transmitter which sends an original media stream and calculates the Row/Column FEC packets (in accordance with ProMpeg FEC or SMPTE2022-1, for example). At another end of the channel, a Receiver attempts to recover any missing packet by using the Row, Column FEC packets. The Row and column FEC packets are sent all the time using special, dedicated UDP ports. The Row and column length is static (e.g. its dimensions are set once and remain the same length for a long duration).

In FIG. 1, transmitter 11 sends serially transmitted packets 123, including data (D1, D2, D3 . . . ) and FEC (R1 . . . ) packets, over a network 12 to a receiver 13.

Data in 111 stream is formed into data to be transmitted 112, in matrix form. A FEC encoder 113 processes the data to generate, for example, a FEC packet R1 114. The data and FEC packets are transmitted through a stack 115. After being transferred through the network 2, serially received packets 124 arrive at receiver 13, with an exemplary lost data packet (D2). In receiver 13, the packets are received in a stack 135, and from there are transferred to a data buffer 136. A received FEC packet R1 134 is transferred to a FEC decoder 133, wherein a recovered D2 packet 137 is generated. The data out, received packets 138 include the lost packet D2, along with the rest of the packets.

A standard media delivery system comprises transmitter 11 and receiver 13 devices; media stream is transmitted using a Real Time
Protocol (RTP) from the transmitter to the receiver. The referenced prior art system does not include built-in support for packet retransmission, as is performed with Data delivery protocols such as TCP.

Embodiments of the present invention improve the efficiency of NEC processing using an adaptive system and method.

SUMMARY OF THE INVENTION

According to one aspect of the present invention, a system uses an adaptive matrix, wherein resolution changes in response to network errors in media over IP networks.

Embodiments of the present invention include means for implementing an adaptive NEC matrix, which can scale up or down, responsive to the error rate in real time. The use of an adaptive size matrix improves the error resilience and the usage of network bandwidth. A corresponding means for using and adapting to variable matrix sizes is required in the transmitters and receivers. The recipient should include means for handling matrix changes between groups of packets.

According to another aspect of the present invention, the system uses an adaptive on demand media packet loss recovery to reduce bandwidth.

The proposed solution consists of a system made of two blocks, a probe device and a detection block, see FIGS. 2 and 3. The probe device probes the media/transport stream and uses its transport stream packet information to calculate FEC reference packets. The detection block accepts the transport stream packets and inspects for any lost packets. Upon detection of a lost/missing packet, the detection block will signal the probing block about the missing packet, by using a RTCP message. The Probing device will use the RTCP information to calculate an optimal FEC solution for the next packet transmissions; these FEC packets will assist the Detection block to reconstruct the lost packets based on the FEC information.

The present patent application is the first of four applications presently filed by the present applicant and inventor. Embodiments of the inventions disclosed in these applications can be used together in various combinations:
1. Adaptive FEC System and Method
2. Packets Recovery System and Method
3. Transport over UDP System and Method
4. Media Stream Rate Reconstruction System and Method Further purposes and benefits of the current invention will become apparent upon reading the present disclosure and the related drawings.

LIST OF DRAWINGS

FIG. 9 illustrates a 2D matrix representation of a stream with row=8, column=5, missing packets D3,14,18-20,27-28,34.

FIG. 10 illustrates a Flat representation of the stream in FIG. 9.

DETAILED DESCRIPTION OF THE INVENTION

Glossary of Terms

Figure 1:
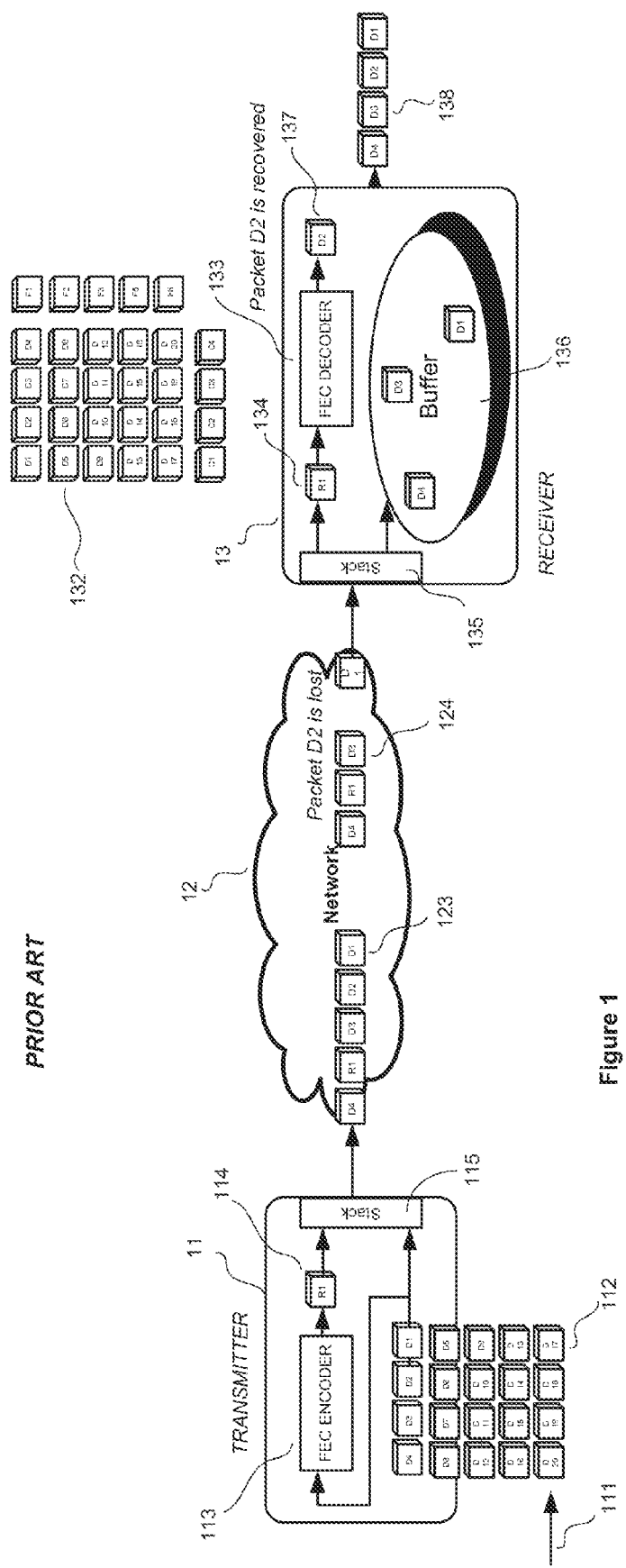
FIG. 1 illustrates a Prior Art System for transmitting media packets with ProMpeg/SMPTE2022 FEC packets.

Throughout the present disclosure, the following terms may be used:

Moving Picture Experts Group (MPEG) is a working group of experts that was formed by ISO and IEC to set standards for audio and video compression and transmission.

MPEG transport stream (TS) is a standard format for transmission and storage of audio, video, and Program and System Information Protocol (PSIP) data, and is used in broadcast systems such as DVB and ATSC. Transport Stream is specified in MPEG-2 Part 1, Systems (formally known as ISO/IEC standard 13818-1 or ITU-T Rec. H.222.0).

TS Packet is the basic unit of data in a transport stream. It consists of a sync byte, whose value is 0x47, followed by three one-bit flags and a 13-bit Packet Identifier (PID). This is followed by a 4-bit continuity counter. Additional optional transport fields, as signaled in the optional adaptation field, may follow. The rest of the packet consists of payload. Packets are 188 bytes in length.

Program Identifier (PID) Each table or elementary stream in a transport stream is identified by a 13-bit packet ID (PID). A demultiplexer extracts elementary streams from the transport stream in part by looking for packets identified by the same PID.

Program Clock Reference (PCR) is transmitted in the adaptation field of an MPEG-2 transport stream packet. The value of the PCR, when properly used, is employed to generate a system timing clock in the decoder. The PCR is used by the decoder to present synchronized content, such as audio tracks matching the associated video, at least once each 100 ms.

Real-time Transport Protocol (RTP) defines a standardized packet format for delivering audio and video over IP networks. RTP is used extensively in communication and entertainment systems that involve streaming media, such as telephony, video teleconference applications, television services and web-based push-to-talk features. RTP is used in conjunction with the RTP Control Protocol (RTCP). While RTP carries the media streams (e.g., audio and video), RTCP is used to monitor transmission statistics and quality of service (QoS) and aids synchronization of multiple streams. RTP is originated and received on even port numbers and the associated RTCP communication uses the next higher odd port number. RTP was developed by the Audio-Video Transport Working Group of the Internet Engineering Task Force (IETF) and first published in 1996 as RFC 1889, superseded by RFC 3550 in 2003.

User Datagram Protocol (UDP) is one of the core members of the Internet Protocol Suite, the set of network protocols used for the Internet. With UDP, computer applications can send messages, in this case referred to as datagrams, to other hosts on an Internet Protocol (IP) network without requiring prior communications to set up special transmission channels or data paths. UDP uses a simple transmission model without implicit handshaking dialogues for providing reliability, ordering, or data integrity. Thus, UDP provides an unreliable service and datagrams may arrive out of order, appear duplicated, or go missing without notice. UDP assumes that error checking and correction is either not necessary or performed in the application, avoiding the overhead of such processing at the network interface level.

Set-top box (STB) is an information appliance device that generally contains an interface to a network and connects to a television set and an external source of signal, turning the signal into content which is then displayed on the television screen or other display device. In IP networks, the set-top box is a small computer providing two-way communications on an IP network and decoding the video streaming media. IP set-top boxes have a built in home network interface which can be Ethernet or one of the existing wire home networking technologies.

Forward Error Correction (FEC)—Technique to recover packet information partial or full, based on calculation made on the information. Such techniques maybe by means of XOR between packets or any other mathematical computation.

Pro-MPEG—the Professional-MPEG Forum—is an association of broadcasters, program makers, equipment manufacturers, and component suppliers with interests in realizing the interoperability of professional television equipment, according to the implementation requirements of broadcasters and other end-users.

SMPTE 2022—The Pro-MPEG Forum began initial work on a FEC scheme for video transport. That work, added to by the Video Services Forum, was introduced to SMPTE. This proposed standard is known as SMPTE 2022, and it describes both a FEC scheme and a way to transport constant bit rate video over IP networks.

Embodiments of the current invention are now described by way of example and with reference to the accompanying drawings.

Figure 2:
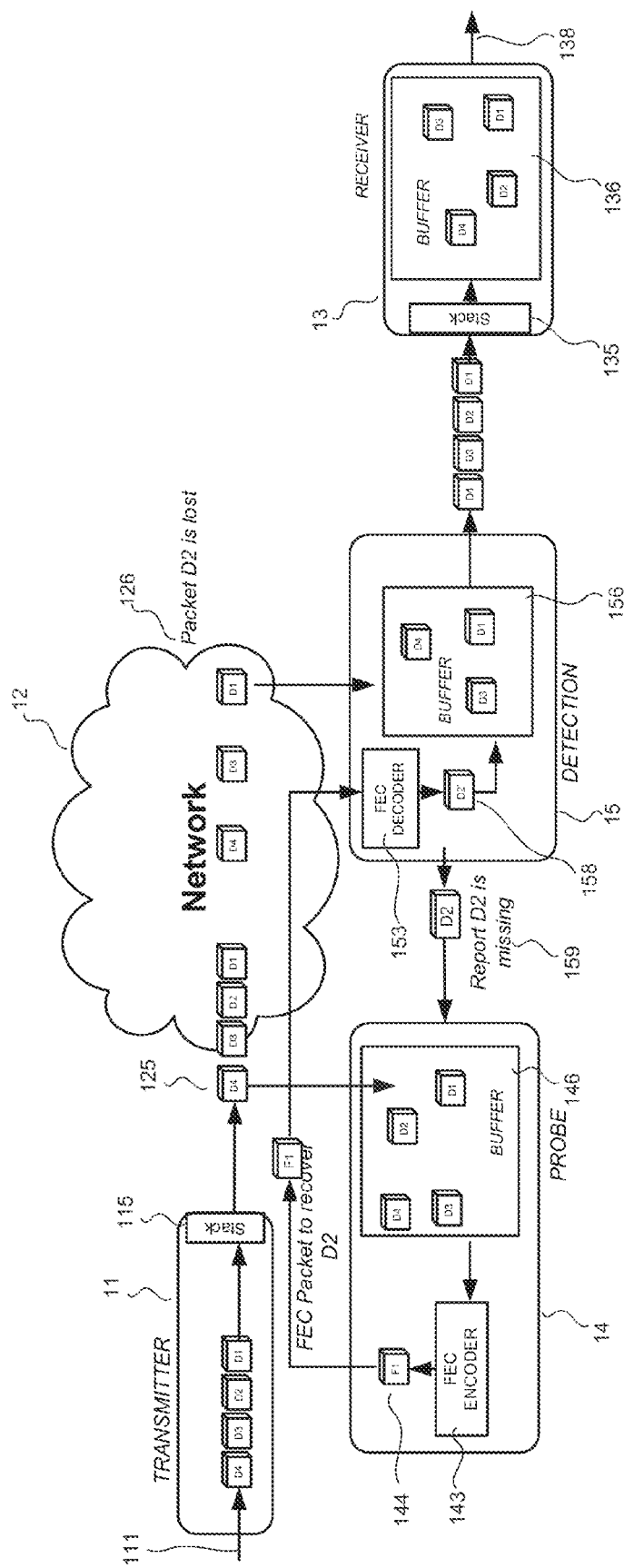
FIG. 2 illustrates a new system to protect media streaming in an intrusive implementation.
Figure 3:
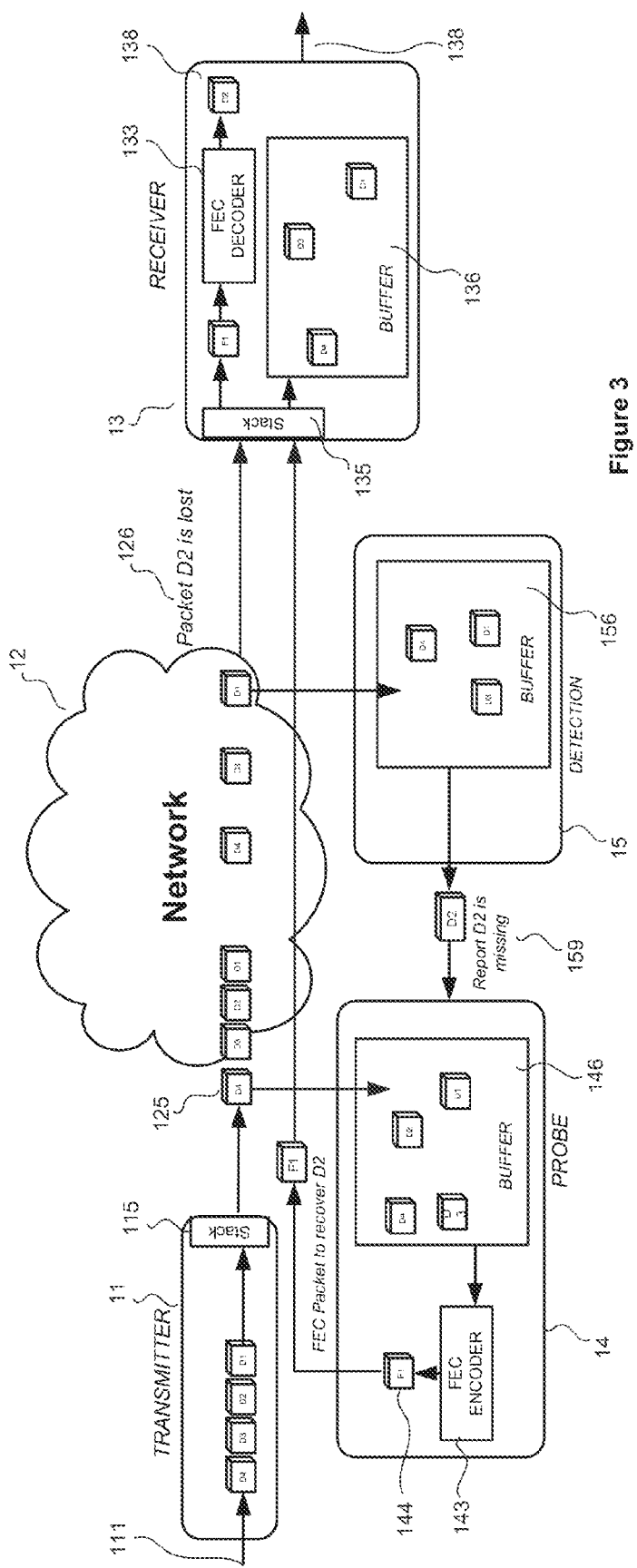
FIG. 3 illustrates a new system to protect media streaming in a non-intrusive implementation.

FIGS. 2 and 3 illustrate a system for protecting media streaming in an intrusive implementation. In an illustrative example of an embodiment of the invention, a media stream encapsulated in MPEG transport may be packetized in 188 byte packets, each packet with a 8 byte header. Every 1 to 7 transport packets are encapsulated into one UDP packet. The UDP packet may be prefixed with an RTP header that includes information about its position in the stream (Sequence number)+(coding information)+(time stamp)+(source contribution list). A RTCP control protocol is running in parallel to the data stream and provides control/status information about the health of the stream, clients and source devices.

The invention consists of a probe device and a detection device. Two embodiments are presented: an intrusive system in FIG. 2; and a non-intrusive system in FIG. 3. There are intrusive and non-intrusive connection options.

The RTCP messaging solution applied in an embodiment of the current invention allows the detection device to send one or more packet loss event messages to the Probe device, to alert of lost packet detection. The proposed system may use this, a multi-layered solution, to send one or more requests of missing events, to provide a higher protection assurance (in case the Probe did not receive the original request or the recovery packet did not reach the detection device). Reception of more than one request for the same loss event may result in one or more protective packets to be sent by the Probe device and the receiving device ignores the duplicate packets and treats the event as packet duplication.

FIG. 2 depicts an intrusive implementation, in which detection device 15 is responsible of handling the packet recovery process. In FIG. 3 detailing the non-intrusive mode, wherein the stream receiver 13 is responsible for recovering packets. The detection device assists by reporting lost packet events to probe device 14.

Probe 14 device includes an IP interface, memory buffer, transport processing block and a processor. Any packet received by the IP interface is forwarded to the memory buffer in a sequential order. The processor device calculates a row and/or Column FEC reference packet based on a ProMpeg or SMPTE2022-1 standard. The FEC packets are sent through different UDP ports (row and column FEC are sent using different, separate UDP ports).

The detection device 15 follows the same probing as the probe device 14. The detection device probes the incoming stream for missing packets and reports by means of an RTCP message. The RTP sequence number is used to generate a list to verify the order of the packets. Whenever disorder is detected, the processor can change the position of the internal packet back to its original state. Whenever packet information is unaccounted for, the detection device can issue a request for Packet loss intervention to occur.

A FEC decoder block 153 receives the sent FEC packets to reconstruct any lost packet. The FEC decoder may inspect each FEC packet, its Row and Column information, to construct the desired row or column packets as needed to reconstruct missing packets, such as D2 158 for example. Any reconstructed packet is return back to the buffered stream.

The RTCP missing packet information is gathered by the probe processor to create a map of events (occasional packet loss, burst lost etc.). The processor modifies the row/column dimension to handle the map of events e.g.; on a burst loss the Processor with increase the Row dimension to allow the column FEC to overcome the burst events.

The system in FIG. 2 comprises a transmitter 11 sending packets through a network 12 to a receiver 13; a probe 14 and a detection device 15.

Data in 111 passing through stack 115, is sent as serially transmitted data packets 125, including data (D1, D2, D3 . . . ) serially received packets 126, with an exemplary lost data packet (D2). In the receiver 13, there is a stack 135 and a data buffer 136. Probe 14 includes a FEC encoder 143, FEC packet F1 144 and buffer 146. Detection device 15 includes a FEC decoder 153 and buffer 156. Also shown are a recovered D2 packet 158, a report packet D2 missing 159 and data out channel with received packets 138.

FIG. 3 illustrates a new system to protect media streaming in a non-intrusive implementation, comprising a transmitter 11, network 12, receiver 13, probe 14 and detection device 15. In this embodiment of the invention, packets do not pass serially from network 12 to detection device 15 and therefrom to receiver 13, as shown in FIG. 2; rather, packets from network 12 are transferred directly to receiver 13, with the detection device also receiving the packets.

Figure 4:
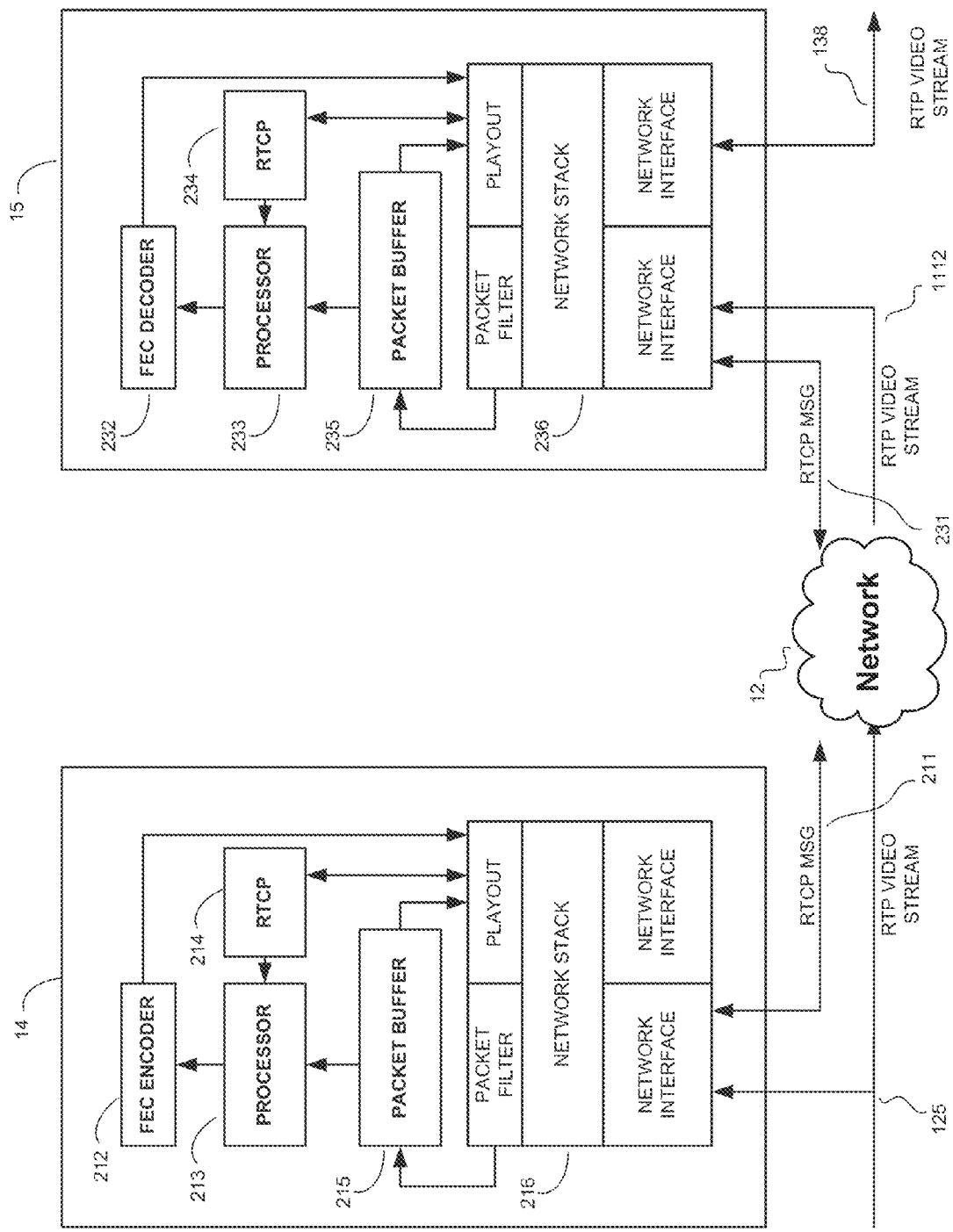
FIG. 4 illustrates an Adaptive FEC System, high level blocks.

FIG. 4 illustrates an Adaptive FEC System, with its high level blocks the Probe 14 and its high level component parts, and the Detection device 15 and its high level component parts. An FEC decoder block 232 receives the sent FEC packets to reconstruct any lost packet. The FEC decoder preferably inspects each FEC packet row and column information to construct the desired row or column packets needed to reconstruct missing packets. Any reconstructed packet is return back to the buffered stream.

The RTCP missing packet information is gathered by the Probe Processor 213 to create a map of events (occasional packet loss, burst lost etc.). Processor 213 modifies the row/column dimension to handle the map of events e.g.; on a burst loss the processor with increase the row dimension to allow the column FEC to overcome the burst events.

Figure 5:
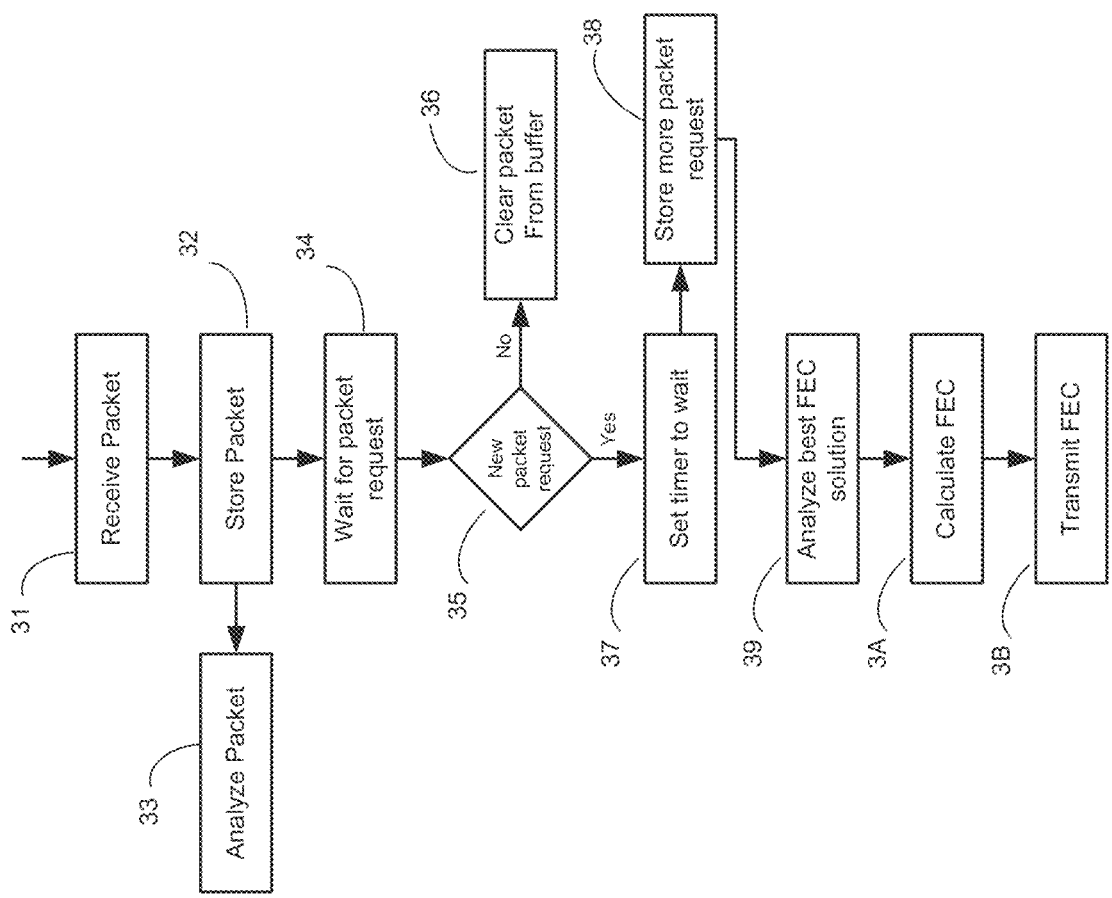
FIG. 5 illustrates a Probe data flow.

FIG. 5 illustrates a Probe data flow.

Figure 6:
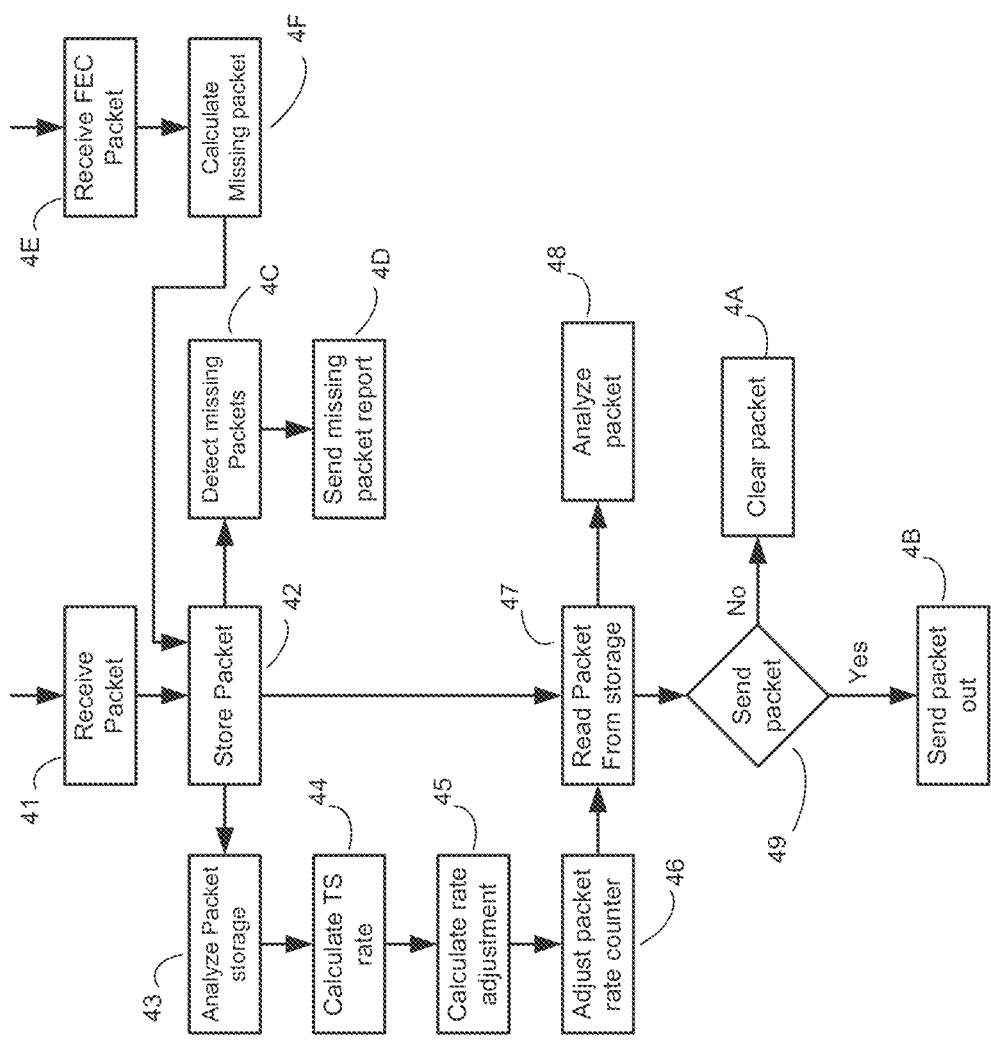
FIG. 6 illustrates a Detection data flow.

Probe Data Flow Method
1. RTP stream packets are received, step 31
2. RTP packets are stored in a dedicated stream buffer/storage, step 32
   a. Stored packets content is analyzed, step 33
3. The device waits for packet requests, step 34
   a. If no new packet request is requested, old packets are cleared from the buffer, steps 35, 36
4. If a packet request is accepted, wait for a predefine period to process several packets at once, while storing the new requests, steps 37, 38
5. Analyze best Matrix dimensions (Row and Column) to recover lost packets, step 39
6. Calculate FEC Matrix based on dimension in step 5, 3A
7. Send FEC packets out, step 3B FIG. 6 illustrates a Detection data flow Detector Data Flow Method
1. RTP stream packets are received, step 41
2. RTP packets are stored in a dedicated stream buffer/storage, step 42
   a. Stored packets content is analyzed, step 43
   b. Calculate rate, step 44
   c. Calculate rate step adjustment, step 45
   d. Adjust rate counter, step 46
3. Packets sequence counter (stored in the RTP header) are scanned for missing packet detection, step 4E, 4F
   a. A RTCP is sent to a Probe device 4D
4. Packets are read out according to their rate out, step 4B
   a. Packets are analyzed to extract their stream, video information and statistics, step 48
5. If Packet is intended to be sent out it is read out else it is cleared 4A
6. FEC Packet is received, step 4E
7. Calculate any missing packet (if applicable), step 4C
8. Write recovered packet to the stream buffer, step 4B.

Figure 7:
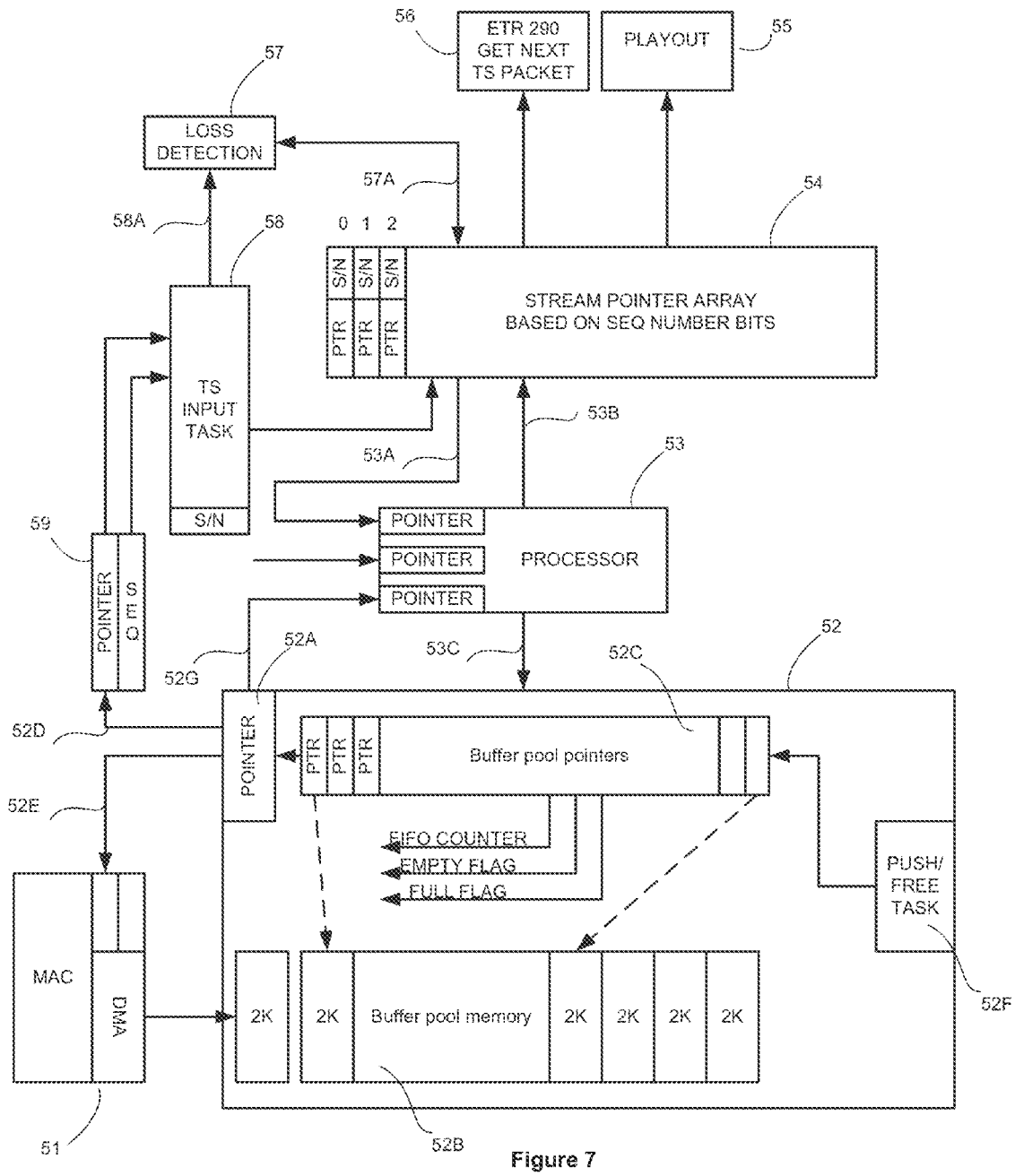
FIG. 7 illustrates a Detection device internal building blocks and data flow.

FIG. 7 illustrates the structure of a Detection device, detailing its internal building blocks and the data flow.
1. Media packets (Video/media or FEC) arrive at the Ethernet MAC port 51. Each packet is stored in a memory buffer, step 52.
2. For each assigned packet, the software assigns a pointer 52E that points to the memory buffer 52B in packet memory management block, step 52.
3. The Software extracts the Sequence number from each Video/media packet header and sends it with the memory pointer 59, 52D to the INPUT processing 58 block.
4. The TS INPUT block 58, copies the packet pointer and Sequence number to the Stream pointer FIFO Pool 54; each entry is indexed according to the Sequence number.
5. The TS INPUT block 58 compares the accepted Packet Sequence number 59 to a previously stored one, to detect an option for missing packets.
6. A Loss Packet detector 57 scans 57A the Stream pointer FIFO pool 54 in the area of the suspected missing packet, to look for additional missing packets. Upon detection of such a packet, the software will issue a RTCP message having the information of one or more missing packets.
7. Packets stored in the Stream pointer FIFO pool 54 may be read by the ETR 290 block 56 according to the pointer, to extract and calculate video information (such as rate, video & Audio codec information, and transport stream performance information according to ETR 290 standard).

8. Play out software block 55 reads packets from the Stream pointer FIFO pool according to a rate calculated from the packet Program Clock Register (PCR) or network rate.

9. Play out software block 55 reads packets from the Stream pointer FIFO pool according to a rate calculated from the packet Program Clock Register (PCR) or network rate. The rate may be calculated based on statistics calculated in the ETR 290 block 56 and supplemented by using the PCR information. The rate may be read from time to time and written to the playout block 55. Any Played packet is then freed from the memory pool 52.

10. Any new FEC packet received is forwarded 52G to the processor block 53 with a pointer for a free memory block to recover lost packets.

11. The Processor block 53 may read 53A one or more pointers from the Stream pointer FIFO pool 54 to recalculate the missing packet in conjunction with the FEC packet.

12. The recovered packet pointer and Sequence numbers are written to the Stream pointer FIFO pool 54 according to the Sequence number 53B.

13. The recovered packet is written to the memory pool for further storage 53C.

Figure 8:
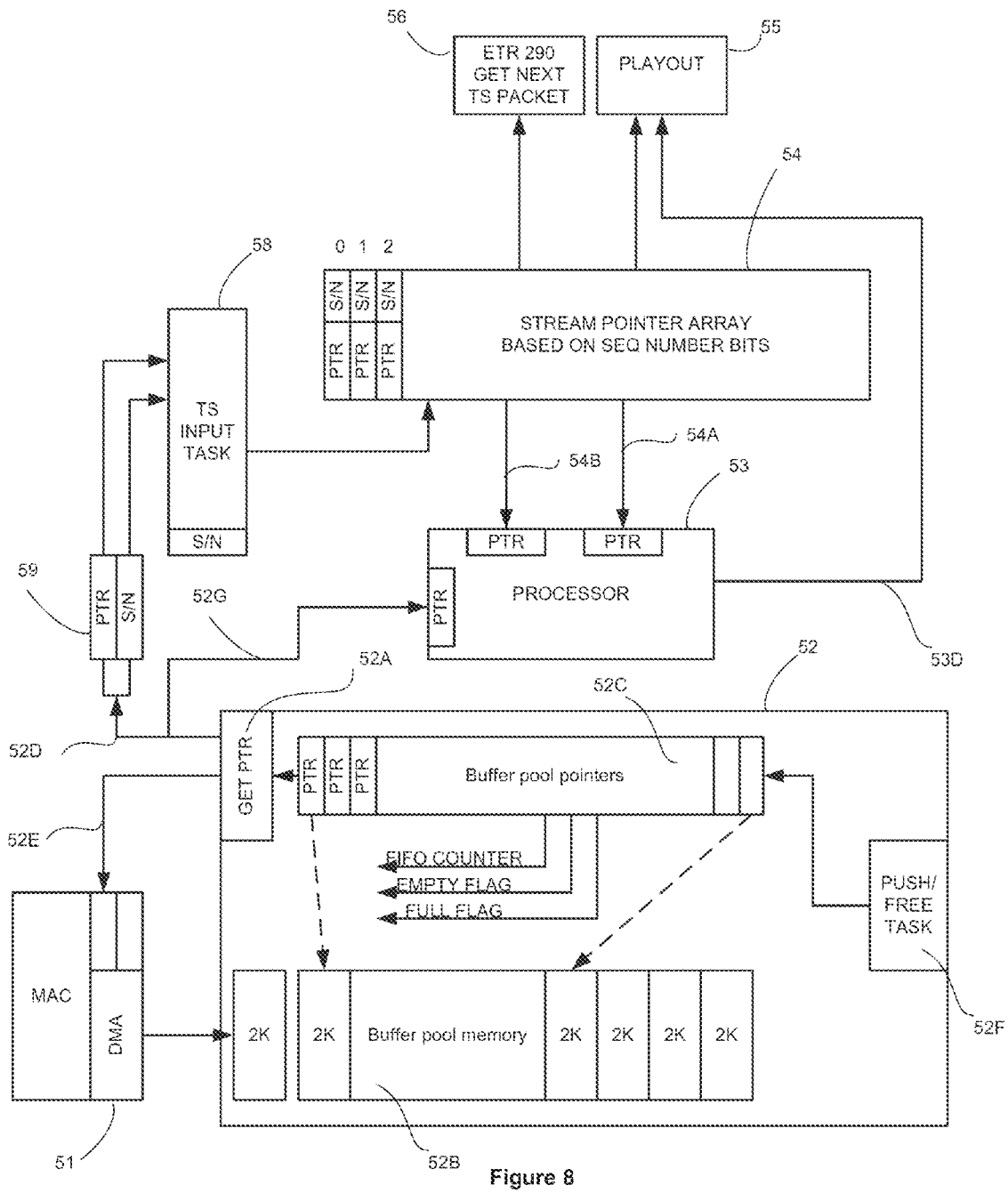
FIG. 8 illustrates a Probe device internal building blocks and data flow.

FIG. 8 illustrates a probe device, detailing its internal building blocks and data flow.

1. Media packets (Video/media or FEC) arrive at the Ethernet MAC port 51.

Each packet is stored in a memory buffer 52.

2. For each assigned packet, the software assigns a pointer 52E that points to the memory buffer 52B in packet memory management block 52.

3. The Software extracts the Sequence number from each Video/media packet header and sends it with the memory pointer 59,52D to the INPUT processing 58 block.

4. The TS INPUT block 58, copies the packet pointer and Sequence number to the Stream pointer FIFO Pool 54; each entry is indexed according to the Sequence number 5. Any RTCP message received by the INPUT 51 is sent 52G to the Processor block 53 to extract the missing packet information.

6. The Processor block 53 reads the requested Packet 54A from the Stream pointer FIFO pool 54.

7. The Processor block 53 may read one or more pointers 54A, 54B from the Stream pointer FIFO pool 54, to calculate the a FEC packet to recover the requested missing packet or packets.

8. The Calculated FEC packet (one or more) are sent to the Play out 55 for transmission 53D

9. A Packet stored in the Stream pointer FIFO pool 54 may be read by the ETR 291 block 56 according to the pointer, to extract and calculate video information (which may include a rate, video & Audio codec information, and transport stream performance information according to ETR 290 standard).

FIG. 9 illustrates a two-dimensional matrix representation of a stream with row=5, column=8, missing packets D3, 14, 18-20, 27-28, 34.

The matrix as shown in FIG. 9 is unrecoverable using standard (prior art) solutions. For example, packets D19, D20, D27, D28 cannot be recovered by standard means because they create an event that more than two packets are lost in either row or column such that No packet may be recovered.

FIGS. 9 and 10 depict the "migration" from a matrix view, as is the case in ProMpeg and SMPTE2022 (Prior Art), to a flat sequential/continuous view as shown in FIG. 10. The stream 125 is riddled with occasional lost packets 1253A-1253G, which are colored gray in the Figure.

Figure 11:
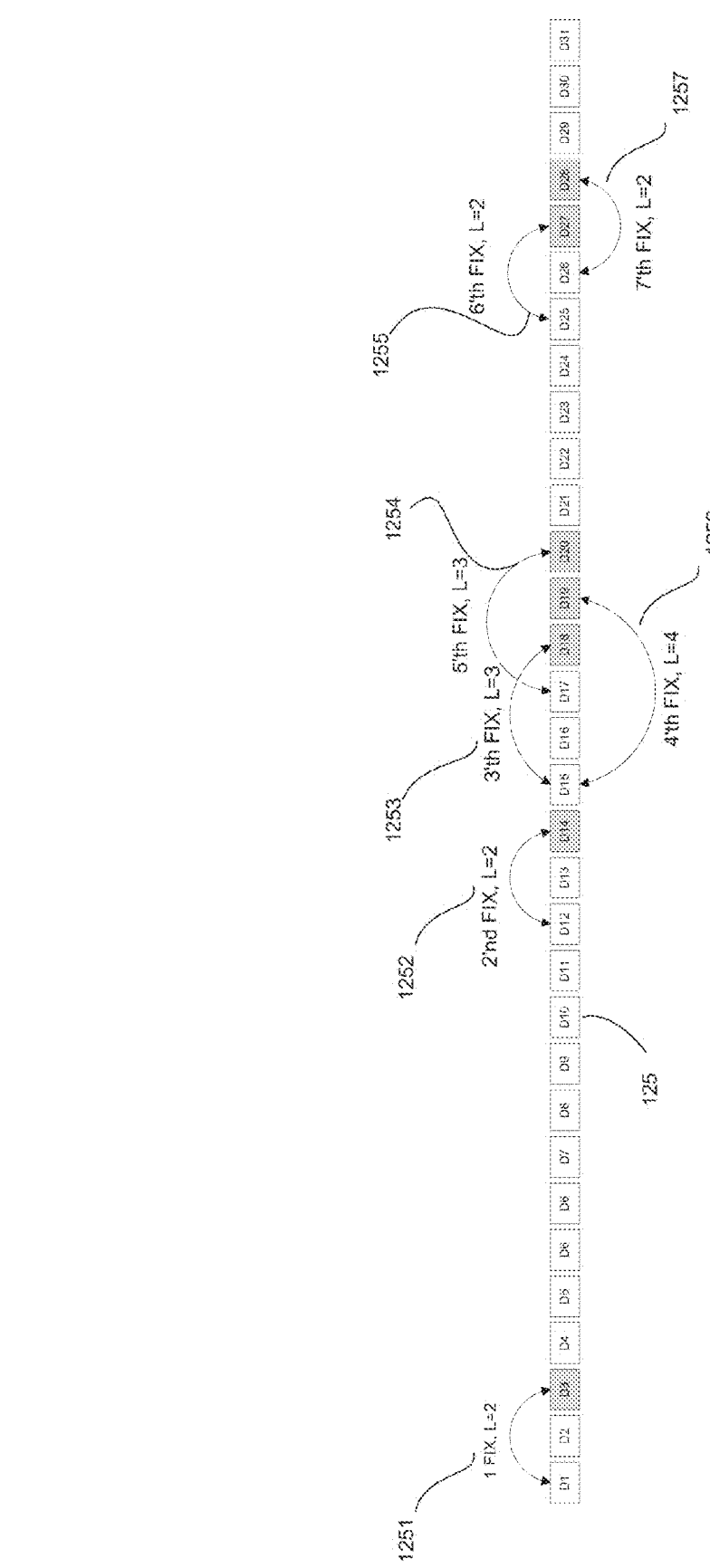
FIG. 11 illustrates a possible packet recovery method for missing packets with various lengths.

FIG. 11 illustrates an example, using the present invention, of a packet recovery method for missing packets with various Lengths. The Figure depicts the FEC packet calculation and various lengths that the invention may call/use to recover lost packets. The Length may be of 2, 3 . . . n.

Calculation Example (See FIGS. 10 and 11):

The basic assumption is: that received packets are always used as reference for a lost packet. This approach assures that both the detection and probe device have the reference packet stored. The system may also consider to use a 'recovered' packet as a reference too (in case no close reference packet is available) The stream has lost several packets 1253A-1253G, A notice of these lost packets reaches the probe device for processing.

For 1253A and 1253B, the system detects that no previous packet were lost, so it can decide to apply a fix 1251 in column fashion in the length of 2, and a fix 1252 in the same length For 1253C, the system detects that it has several packets till 1253B that were not lost, so it can decide to apply a fix 1253 in column fashion in the length of 3.

For 1253D, the system detects that it has several packets till 1253B that were not lost (except 1253C), so it can decide to apply a fix 1256 in column fashion in the length of 4 and use the same reference packet as for 1253C.

For 1253E, the system detects that it has several packets till 1253B that were not lost (except 1253C,1253D), so it can decide to apply a fix 1254 in column fashion in the length of 3.

For 1253F and 125G, the system detects that no previous packet were lost, so it can decide to apply a fix 1255 in column fashion in the length of 2, and fix 1257 in the same length FIGS. 9-11 also depict the bandwidth savings with an adaptive FEC: the Matrix in FIG. 9 is 8×5 in size, which will correlate to 5+8 protection packets (8 column+5 row at a constant bandwidth taken all the time). The solution with adaptive FEC in FIG. 10 shows that we need only 8 correction packets (for 1253A-1253G) and may be used only when needed.

Figure 12:
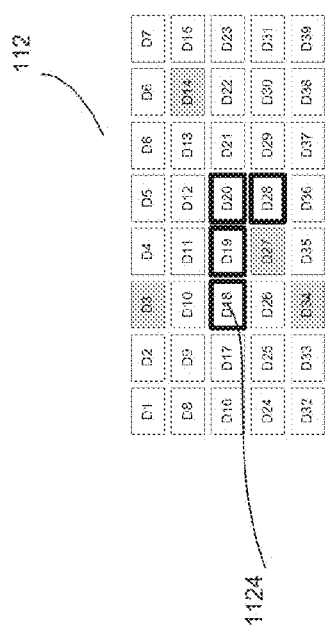
FIG. 12 illustrates a 2D matrix and Flat representation of a stream with row=8, column=5, with two missing packet types D3,14, 27,34 and D18-20, 28 each from a different client.
Figure 13:
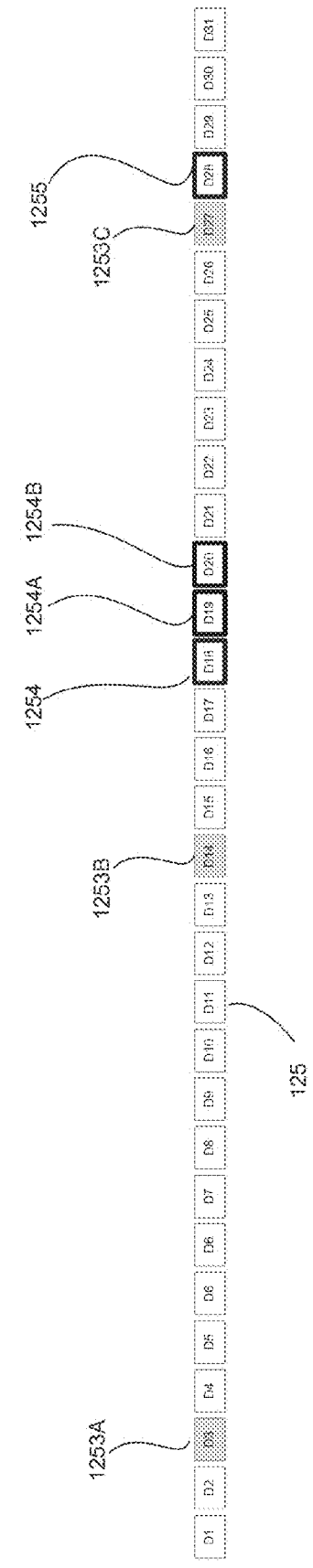
FIG. 13 illustrates a possible packet recovery method for missing packets with various lengths.
Figure 15:
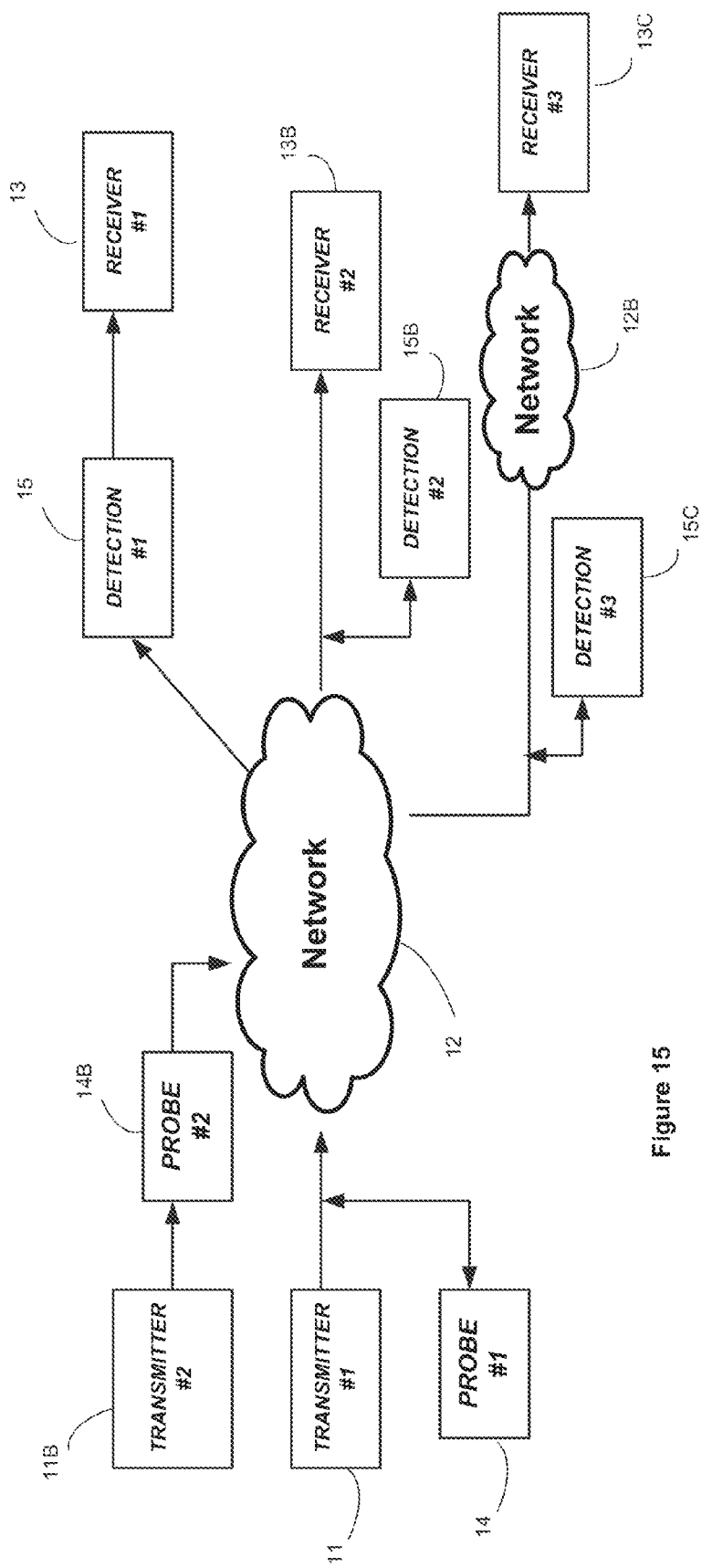
FIG. 15 illustrates a system architecture including both intrusive and non-intrusive deployment topology.

FIGS. 12 and 13 illustrate, by way of example, a prior art two-dimensional matrix (FIG. 12) and a novel Flat representation (FIG. 13) of a stream with row=5, column=8, with two missing packet types D3, 14, 27,34 and D18-20, 28 each possibly from a different client (see FIG. 15, Detection devices 15, 15B, 15C).

Figure 14:
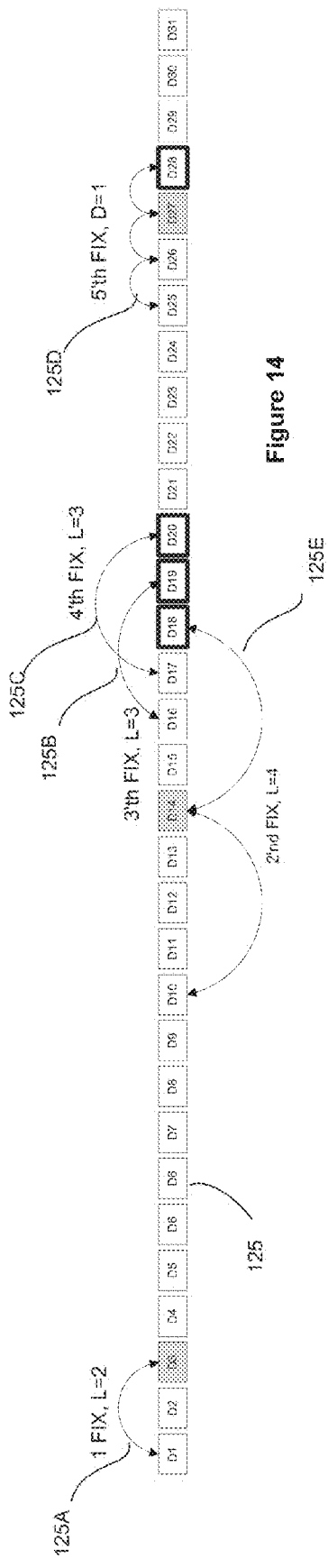
FIG. 14 illustrates FEC packet calculation and various lengths that the system may call or use to recover lost packets.

FIGS. 13 and 14 depict the ability to process several clients/users, which is an important benefit of embodiments of the present invention:

FIG. 13 depicts a flat view of the stream, illustrating a received stream 125 in the Detection device clients with missing packets:

Client #1 is missing packets 1253A,1235B,1253C
Client #2 is missing packets 1254A,1254B,1254C
Client #3 is missing packets 1253C and 1255.

FIG. 14 presents one way to address the problem, so as to solve it:

Fix 125A solves the loss of 1253A by way of a column in the length of 2

Fix 125B solves the loss of 1254A by way of a column in the length of 3

Fix 125C solves the loss of 1254B by way of a column in the length of 3

Fix 125D shows two different missing packets: 1255 is missing from client #3 while 1253C is missing for both client #1 and #3. The solution is to do a Row FEC in size 4 and use several reference packet to recover the two lost packets. In this case, a single FEC reference packet will reconstruct 1255 and 1253C.

Fix 125E shows two different missing packets: 1253B is missing from client #1 while 1254 is missing for client #2. The solution is to do column FEC in size 4 and use a combination of 1253B+1254 and reference packet to generate a single FEC reference packet will reconstruct 1253B and 1254.

Thus, in accordance with embodiments of the present invention, there are provided a means in the network for calculating one common FEC packet supporting (referring to) packets sent from two or more transmitters (clients). This option for addressing together the needs of different clients saves bandwidth, because of the elimination of additional packets for each client.

In this example it is shown that:

A prior art system needs 13 packets (8 columns+5 rows sent at constant bandwidth taken all the time); whereas in an embodiment of the present invention, using the adaptive FEC as shown in FIG. 14, only 5 correction packets are needed, and it may be used only when needed.

FIGS. 12, 13 and 14 illustrate an example of one embodiment of a packet recovery method for missing packets with various Lengths.

FIGS. 12 and 13 depict the "migration" from a matrix view, as is the case in ProMpeg and SMPTE2021 (FIG. 12), to a flat sequential/continuous view (FIG. 13). Two types of lost packets are depicted; client #1 lost packets are colored gray while client #2 are highlighted with black borders 1124.

FIG. 14 depicts the FEC packet calculation and various lengths that an embodiment of the current the invention may call or use to recover lost packets. The Length may be of 2, 3 . . . n. A single FEC packet can recover D14 and D18, which reduce the over head bandwidth. The matrix as shown in FIG. 12 is unrecoverable by standard (prior art) solutions (e.g. packets D19,D20,D27,D28 cannot be recovered by standard means).

FIG. 15 illustrates a system architecture including both intrusive and non-intrusive deployment topology. The figure shows a system description and the various options for deploying Probe and Detection devices. For example, Probe #1 14 is connected Ma non-intrusive mode (in parallel with transmitter #1 11), whereas Probe #2 14B is connected in an intrusive mode (in series with transmitter #2 11B). The Detection device #1 15 is connected in an intrusive mode (in series with receiver #1 13), whereas the Detection devices #2 15B and #3 15C are connected in a non-intrusive mode (in parallel with receivers #2 13B and #3 13C respectively).

The Intrusive devices (Probe #2, Detection #1) have at least one input and one output interface. Data flows from input to output with added processing in the device itself.

A benefit of using an intrusive probe device (Probe #2) is a simpler data flow through each element; data flow from Transmitter #2 through Probe #2 allows for easy connection and a clear traffic flow, so that the Probe device will be assured to get all the packets from the transmitter into his packet buffer.

A benefit of using a Detection device in an intrusive mode is a larger buffer, which can shield/buffer the Receiver device from network artifacts such as jitter, packet reorder and packet loss.

Another benefit of the intrusive mode is that it allows the Detection device (see Detection #1 15) to recover packets without the knowledge of the receiver (Receiver #1 13) and perform a rate adjust.

The non-intrusive device (Probe #1 14, Detection #2 15B and #3 15C) are devices which have only a common input and output interface, Data flow in and out of the device with added processing in the device. A benefit of using a non-intrusive device is an ability to put it anywhere in the network in a seamless fashion, so that it does not disturb the original network traffic. The devices can be simply added to the network and add their capabilities.

Probe #1 14 is added in parallel to the Transmitter #1 11; it is up to the network operator to duplicate/direct the traffic from Transmitter #1 11 to allow Probe #1 14 to capture the packets in its memory buffer.

Detection #2 15B and #3 15C may be placed somewhere along the network 12 to allow them to detect packet loss events and alert the Probe device 14 or 14B to take action.

The system and method described hereinabove may be used in conjunction with: a system which consists of adaptive FEC block+network jitter reduction and/or with a system which consist of adaptive FEC matrix block+network jitter reduction.

Embodiments of the present invention comprise system solution to protect a media network from artifacts of packet loss and improve use of network bandwidth. The system consists of a probe device (Probe #1,#2) connected in an intrusive or non-intrusive mode, and a Detection device (Detection #1), connected in a intrusive mode, see FIG. 15.

The detection device performs two major tasks: Adaptive FEC packet correction and Network jitter reduction. A novel feature of this solution is that the detection device shields the network artifacts from the receiver device (receiver #1 13) to allow it to receive a media stream free of lost packets and with a minimal jitter—which are crucial to media reception solutions.

A System Consisting of One of the Adaptive FEC/Matrix Patents+Network Jitter Reduction Embodiments of the present invention comprise a system solution to protect a UDP streaming network from artifacts of packet loss and network jitter; the system consists of a probe device (Probe #1,#2) connected in an intrusive or non-intrusive mode and a detection device (Detection #1) connected in an intrusive mode.

Figure 16:
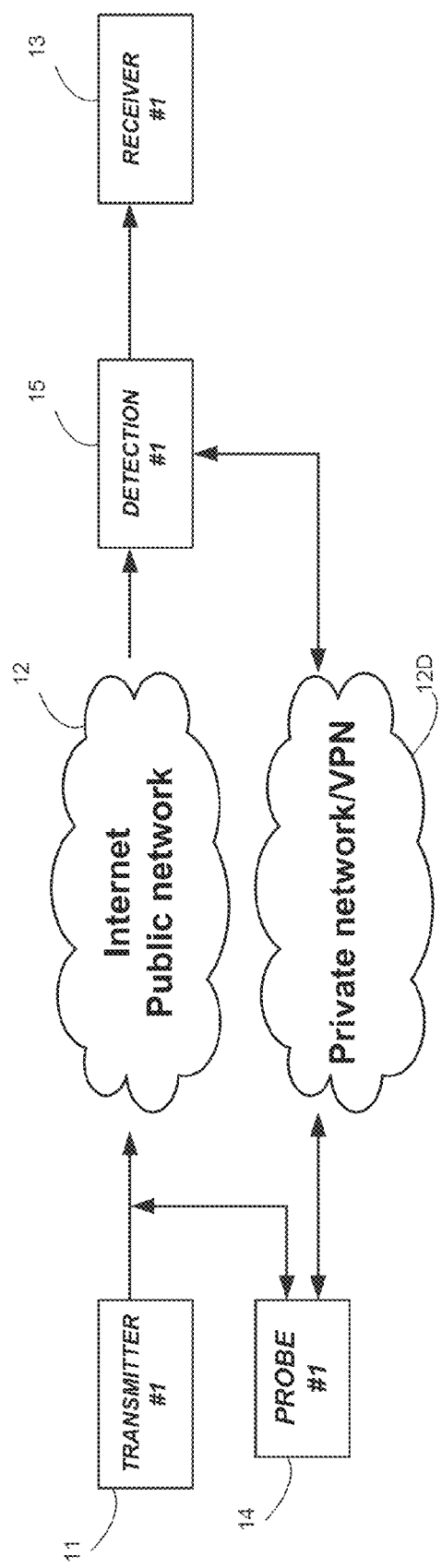
FIG. 16 illustrates a system architecture using both a public and a private network.

FIG. 16 illustrates a system architecture using both a public and a private network. The stream passes through the public network 12 to the detection device 15, while corrective action passes through a private/VPN network 12D (which preferably should be error free or may have a lower error rate).

A probe device (Probe #1 14) connects to the stream for media packet buffering and to a VPN 12D connection for RTCP and Recovery packets. A detection device (Detection #1 15) may connect in an intrusive mode to both the data stream and a VPN connection. The detection device will buffer the received packets in its packet memory buffer and use the VPN connection to request and receive correction packets (this feature can be used for example in adaptive FEC, Adaptive matrix, retransmission).

The Detection device 15 will shield/buffer the network jitter from the receiver device (Receiver #1 13).

Figure 17:
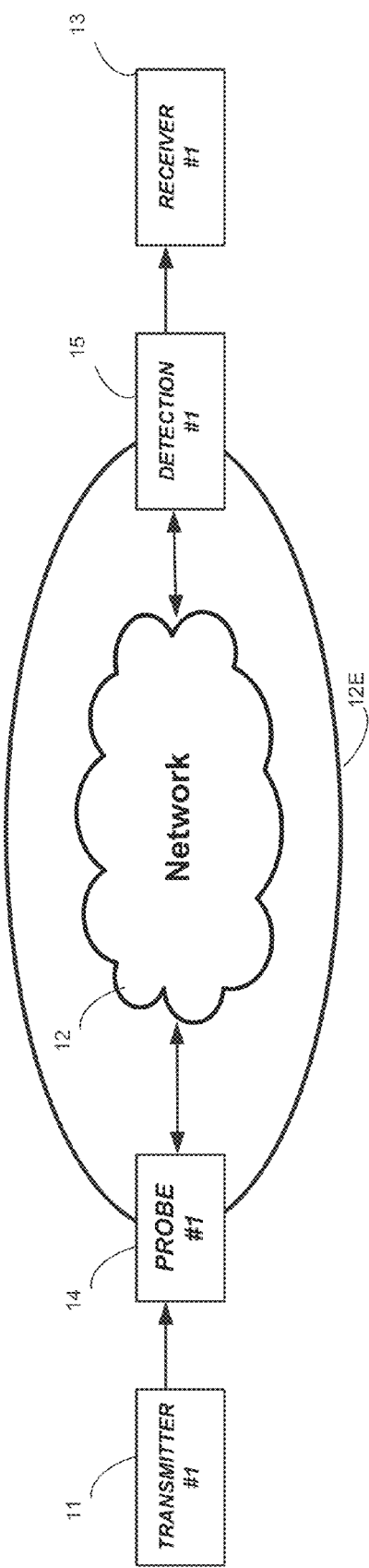
FIG. 17 illustrates a system architecture wherein a probe and detection means communicate through the network and apply an adaptive FEC/Matrix.

A Solution for Converting from UDP to RTP with Adaptive FEC/Matrix Protection and Back to UDP This system may be used to stream a UDP media stream from one transmitter 11 to a one or more Receivers 13 (see FIG. 17). The incoming stream is buffered in the probe (probe #1 14) Packet buffer. Each UDP packet is converted by the Probe device 14 from an UDP protocol to a RTP protocol, for example by adding a RTP header and a virtual time stamp to each UDP packet.

The Probe 14 and the Detection 15 devices may then use an additional method to recover loss packets in the stream between them. The major benefit is the ability to convert from an unrecoverable streaming protocol to a recoverable one and back to a system that does not support RTP protocol.

FIG. 17 illustrates a system architecture wherein a probe 14 and detection means 15 communicate through the network 12 and apply an adaptive FEC/Matrix, for a transmission from the transmitter #1 11 to the receiver #1 13.

The UDP stream entering the Probe 14 is first converted to RTP, while the detection device 15 converts back from RTP to UDP. The detection device 15 buffers the received packets and applies a correction to recover lost packets.

The detection device 15 strips the RTP header from each packet to convert it back to a UDP and transmit it to the receiver (receiver #1 13). The Packets are sent using the rate jitter reduction patent to reduce the network jitter.

A Solution for Using Adaptive FEC Packets/Matrix for Streaming Over Internet

This feature may be used with an adaptive FEC method and system, and/or a jitter reduction system and method, to stream over a public internet. The solution includes re-multiplexing each stream into 1-N different UDP ports, wherein each carries a portion of the packets (e.g. 1/N, N number of selected paths). Each path may be protected using an Adaptive FEC system and method to protect against packet loss in that specific path.

Figure 18:
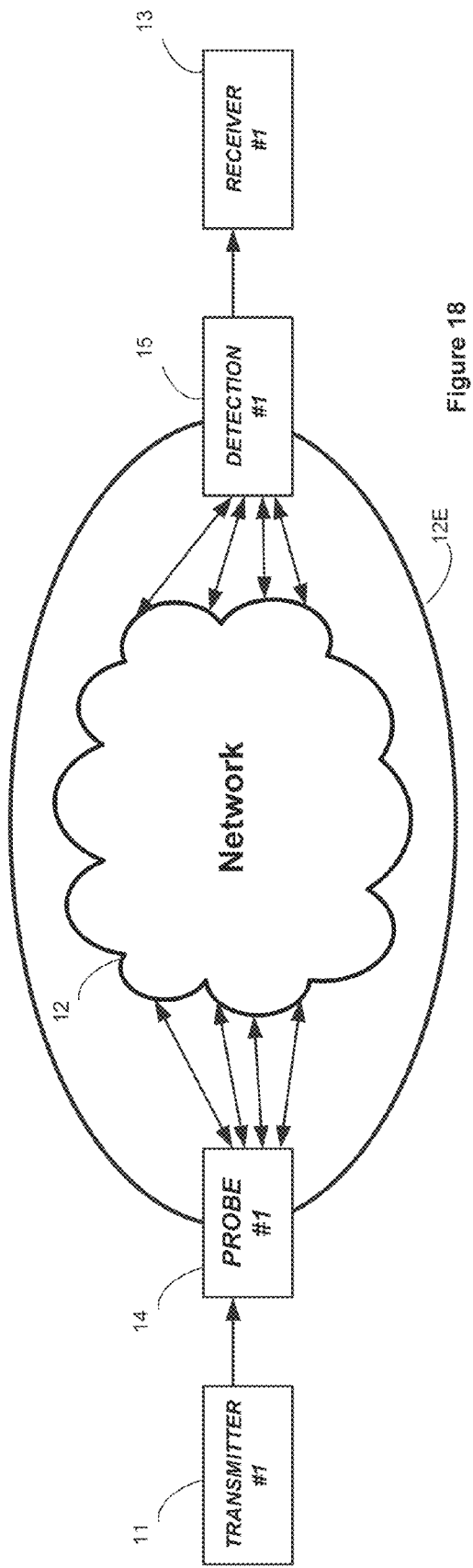
FIG. 18 illustrates an optional improvement of the IP video delivery network using a probe and a detection device.

FIG. 18 illustrates an optional improvement of the IP video delivery network, using a probe 14 and a detection device 15. In the example as illustrated, a transmitter 11 sends packets through a probe 14, a network 12 and a detection device 15, to a receiver 13. This optional improvement uses adaptive FEC packets/matrix for streaming over a public internet. The system uses re-multiplexing each stream into 1-N different UDP ports; each carrying a portion of the packets (e.g. 1/N, N number of selected paths). Each path will be protected by an Adaptive FEC patent to protect against packet loss in that specific path.

As illustrated in FIG. 18, the Probe 14 splits the original stream into multiple smaller streams (up to N) while the detection device 15 receives the stream and applies an adaptive FEC/Matrix to each smaller stream. The detection device 15 then re-multiplexes these streams into a single stream which is sent to the receiver #1 13.

Probe device 14 may include an additional block module to re-multiplex the stream into partial streams send on different ports. The multiplexing may be according to a modulo N basis (e.g. each packet will be assigned to a port according to its Sequence number) or any other priority scheme. In an embodiment, each new stream should be assigned with at least 5 UDP ports (1 data, +1 RTCP, +2 Column FEC, +4 Row FEC). Probe other modules are left unchanged (e.g. packet buffer, processor) and the only addition is a block to re-multiplex the stream; any RTCP message is considered as a request from a detection device and will be handled with no change.

Probe device 14 should preferably be connected in an intrusive fashion (in series with the transmit path, see FIG. 2) so that the transmitting device need not be aware of the re-multiplexing of the original stream.

Detection device 15 may have an additional module for multiplexing back the partial streams before being stored in the packet memory buffer. Detection device 15 may have to maintain N clients for each partial stream. Each client passes the received packet to the packet buffer memory. Each client maintains a missing packet detection process for each partial stream. In the event of a missing packet detection, the client issues a RTCP message associated with that stream UDP port number. Each client transfers the FEC packet to the processor to recover the lost packet.

Detection device 15 may perform a jitter reduction method to send the packet to the original destination.

Use of an Adaptive FEC in a Cloud Solution:

Optionally, the method described hereinabove may be used in a Cloud implementation. This may be implemented with the addition of a VPN to each path.

It will be recognized that the foregoing is but one example of an apparatus and method within the scope of the present invention and that various modifications will occur to those skilled in the art upon reading the disclosure set forth hereinbefore.

What is claimed is:

1. In a network for reliable transfer of packets from at least one original media stream transmitter to at least one receiver using an Internet Protocol (IP) employing real-time streaming using Real Time Protocol (RTP) and compatible with ProMPEG/SMPTE2022-1 FEC packets over IP;
   a system configured to reduce bandwidth use in recovering lost media packets, the system comprising a detection block (detector), associated with the at least one receiver, for detection of lost media stream packets, and a probe device (probe), associated with the at least one original media stream transmitter;
   the detector configured to send an RTCP lost media stream packet message (report) to the probe subsequent to the detector detecting a lost media stream packet;
   the probe including a buffer configured to store all received media stream packets and the probe further configured not to send any FEC reference packet when no report is received and, when the report is received, the probe further configured to wait for additional reports and to then calculate one common FEC reference packet to address reconstruction of at least one lost media stream packet of at least one detector;
   the calculated FEC reference packet configured to be transmitted by the probe in a subsequent packet transmission to the at least one receiver to recover the at least one lost media stream packet; and
   wherein the detector is further configured to perform network jitter reduction.

2. The system according to claim 1, wherein the probe comprises:
   means for packet reception and storage;
   means for computing the FEC reference packet; wherein the FEC reference packet is computed based upon the report from the at least one detector;
   means for transmitting the FEC reference packet; and
   means for receiving reports on lost media stream packets from the detector and for computing an error rate accordingly.

3. The system according to claim 1, wherein the detector comprises:
   means for packets reception and storage, wherein the packets comprise data packets and FEC reference packets,
   means for detecting the lost media stream packets,
   means for reconstructing the lost media stream packets using the FEC reference packets,
   means for transmitting the report, and means for sending reports relating to the lost media stream packets to the probe.

4. The system according to claim 2, wherein the means for computing the error rate are located in the detector, and the detector further includes means for sending error rate information to the probe.

5. The system according to any of the claims 1 to 3, wherein the probe is connected in an intrusive structure, in series with the at least one transmitter.

6. The system according to any of the claims 1 to 3, wherein the probe is connected in a non-intrusive structure, in parallel with the at least one transmitter.

7. The system according to any of the claims 1 to 4, wherein the detector is connected in an intrusive structure, in series with the at least one receiver.

8. The system according to any of the claims 1 to 5, wherein the detector is connected in a non-intrusive structure, in parallel with the at least one receiver.

9. The system according to any of the claims 1 to 7, wherein the packets comprise a media stream or a plurality of media streams.

10. The system according to any of the claims 1 to 7, wherein the packets comprise a video over IP stream or a plurality of video over IP streams.

11. The system according to any of the claims 1 to 7, wherein the detector further includes means for sending one or more lost media stream packet event messages to the probe, to alert of lost media stream packet detection, and wherein the system uses a multi-layered solution to send one or more requests of missing events to enhance protection assurance.

12. The system according to claim 11, wherein the at least one receiver further includes means which, in case of reception of more than one request for the same lost media stream packet event, a result of which one or more protective packets is sent by the probe, the receiving device is configured to ignore duplicate packets and to make an indication of a packet duplication event.

13. The system according to any of the claims 1 to 7, wherein the detector further includes a large buffer, wherein a size of the buffer is computed so as to allow the buffer to shield/buffer the receiver from undesirable network artifacts such as: jitter; packet reorder; and/or packet loss.

14. The system according to any of the claims 1 to 7, wherein the detector further includes a jitter buffer, and wherein a size of the jitter buffer is determined to allow necessary time for communication between the probe and the detector in which to recover the lost media stream packets.

15. The system according to any of the claims 1 to 7, wherein the probe and detector further include means for rate restoration calculation by the use of PCR (Program Clock Reference) information embedded in the original media stream, the PCR information is used to create an output packet playout rate.

* * * * *